United States Patent [19]

Freedman

[11] Patent Number: 5,227,604
[45] Date of Patent: Jul. 13, 1993

[54] ATMOSPHERIC PRESSURE GASEOUS-FLUX-ASSISTED LASER REFLOW SOLDERING

[75] Inventor: Gary M. Freedman, Stow, Mass.
[73] Assignee: Digital Equipment Corporation, Maynard, Mass.
[21] Appl. No.: 723,203
[22] Filed: Jun. 28, 1991
[51] Int. Cl.⁵ .............................................. B23K 26/00
[52] U.S. Cl. ........................... 219/121.63; 219/121.64; 219/121.84; 219/121.86
[58] Field of Search ..................... 219/121.75, 121.84, 219/121.63, 121.64, 121.84, 121.82, 121.12, 121.13, 121.86, 121.21

[56] References Cited

U.S. PATENT DOCUMENTS

| | | | |
|---|---|---|---|
| 3,571,555 | 3/1971 | Townes | 219/121.84 |
| 3,597,578 | 8/1971 | Sullivan et al. | 219/121.67 |
| 3,614,832 | 10/1971 | Chance et al. | 29/626 |
| 3,941,293 | 2/1974 | Chartet | 228/44.3 |
| 4,127,761 | 11/1978 | Pauley et al. | 219/121 L |
| 4,162,390 | 7/1979 | Kelly | 219/121 LM |
| 4,278,867 | 7/1981 | Tan | 219/121 LD |
| 4,324,972 | 4/1982 | Furrer et al. | 219/121.84 |
| 4,390,774 | 6/1983 | Steen et al. | 219/121.84 |
| 4,674,673 | 6/1987 | Parrish | 228/174 |
| 4,720,620 | 1/1988 | Arima | 437/173 |
| 4,914,269 | 4/1990 | Kinsman et al. | 219/121.64 |
| 4,926,022 | 5/1990 | Freedman | 219/121.63 |
| 4,945,207 | 7/1990 | Arai | 219/121.84 |
| 4,970,365 | 11/1990 | Chalco | 219/121.63 |
| 4,978,835 | 12/1990 | Luijtjes et al. | 219/121.64 |
| 4,990,741 | 2/1991 | Moores et al. | 219/121.64 |

FOREIGN PATENT DOCUMENTS 315000 5/1989 European Pat. Off. .
440264 8/1991 European Pat. Off. .
3737565 5/1989 Fed. Rep. of Germany .

OTHER PUBLICATIONS

Bonsels, "Soldering of Printed Circuit Boards, Safe For the Environment When Done Under a Cover Gas", undated, pp. 1-4.
Hartmann, "Nitrogen Atmosphere Soldering", Circuits Assembly, Jan. 1991.
Hartmann, "Soft Soldering Under Cover Gas", undated, pp. 1-11.
Fodor & Lensch, "Cover Gas Soldering Leaves Nothing to Clean Off PCB Assembly", Electronic Packaging & Production, Apr. 1990, pp. 64–66.
Moscowitz & Davidson, "Summary Abstract: Laser-Assisted Dry Process Soldering", J. Vac. Sci. Technol. A, vol. 3, May/Jun. 1985.
Nowotarski, "Fluxless Soldering with Nitrogen", pp. 459–472.
Chalco et al., "Discrete Wire Bonding Using Laser Energy", ISHM 1987 Proceedings, p. 434.
Moscowitz, Yeh & Ray, "Thermal dry process soldering", J. Vac. Sci. Technol. A 4(3), May/Jun. 1986, pp. 838-840.
Nowotarski & Mead, "The Effects of Nitrogen for IR Reflow Soldering", SMART IV Conference Proceedings, Jan. 11-14, 1988.

Primary Examiner—C. L. Albritton
Attorney, Agent, or Firm—Arnold, White & Durkee

[57] ABSTRACT

An atmospheric pressure gaseous flux-assisted laser reflow soldering system provides a means of finely controlled soldering while eliminating post-soldering cleanup with environmentally damaging cleaning agents.

16 Claims, 4 Drawing Sheets

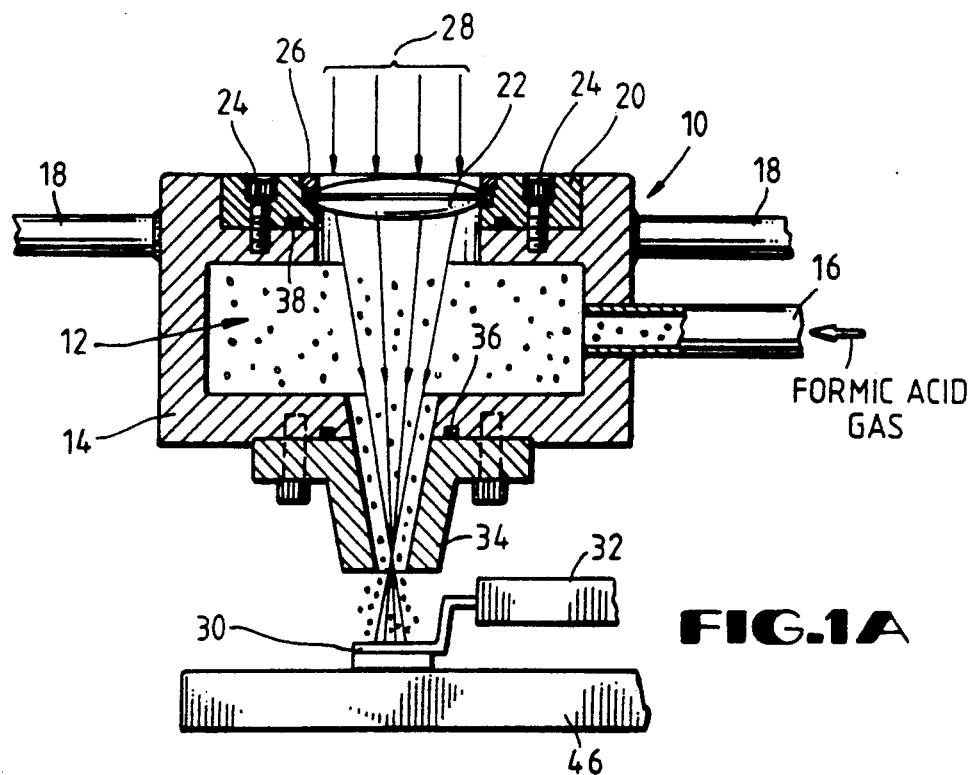
FIG.1A
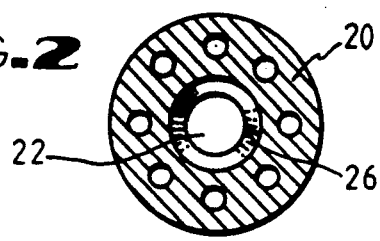
FIG.2
FIG.1B
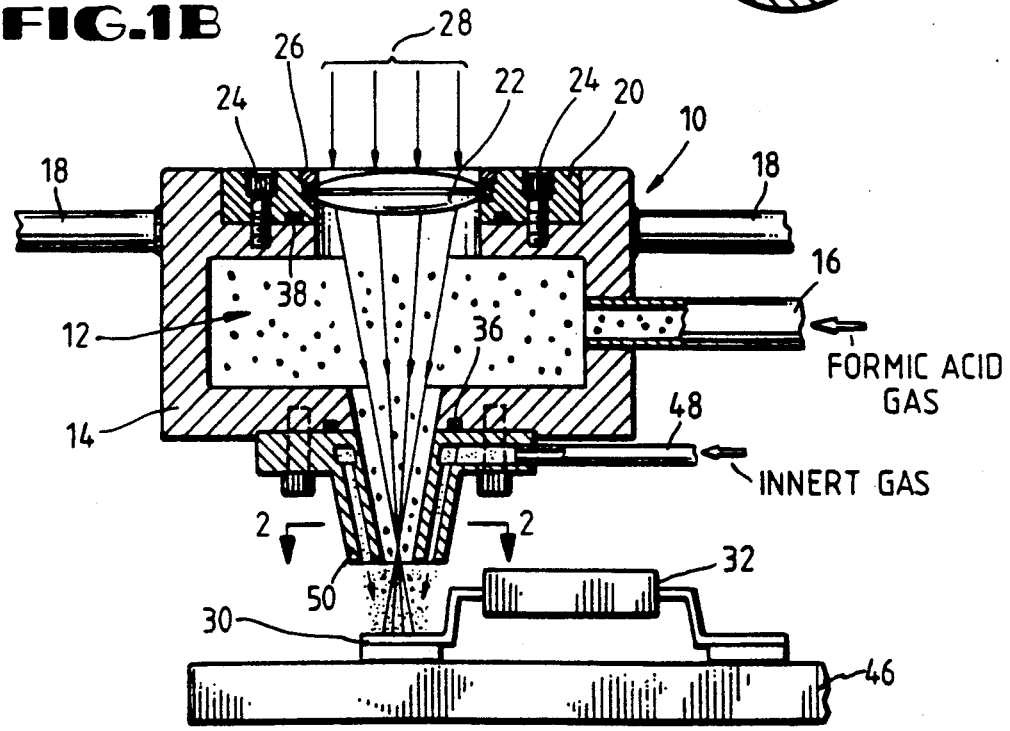

ATMOSPHERIC PRESSURE GASEOUS-FLUX-ASSISTED LASER REFLOW SOLDERING

FIELD OF THE INVENTION

This invention relates generally to a method and an apparatus for reflow soldering and more particularly to laser assisted reflow soldering using a gaseous flux at atmospheric pressures. The process and apparatus delivers an atmosphere rich in a gas which serves as fluxing agent to assist in laser reflow soldering of surface mount or tape-automated-bonding components to printed wiring boards or multi-chip modules.

BACKGROUND OF THE INVENTION

Most metals oxidize rapidly resulting in thin encapsulating oxide layers on their outer surfaces. This is also the case for solder metals. As solder is heated for reflow soldering, the thin oxide layer remains, thus prohibiting proper wetting of the molten solder and preventing bond formation between device lead and substrate pad.

Soldering requires that the thin oxide film, typically on the order of 100 Å thick, on the surface of both the solder and the substrate be removed or otherwise modified so as to permit wetting. The traditional method of soldering involves the use of a liquid solder flux to remove the oxide. However, chemically active liquid solder fluxes may be corrosive. Thus, cleaning of the flux and flux residues is required in order to prevent corrosion. In addition, liquid solder flux may cause solder splattering or leave voids.

As used herein, the terms "soldering" and "reflow" may be used interchangeably. The significant point is that solder, such as lead-based solder, a tin-based solder, a combination of lead and tin, or other solder is present in the vicinity of a pin of an electronic device such as an integrated circuit chip and the substrate to which it is to be soldered. The soldering or reflow process melts the solder and provides a solid electrical and mechanical connection for the pin to a substrate upon solder solidification.

Some fluxes are viscous and sticky while other fluxes are watery. A conventional liquid flux leaves a residue which may impair the electrical characteristics of the substrate (such as a printed circuit board) or of components. The residue may bear chemicals which are corrosive or may absorb moisture. The moisture attaches to residue salts and may result in electrically conductive paths which ultimately yield electrical shorting. The residue may also make visual solder joint inspection difficult or even impossible.

The removal of some flux residues is expensive and may require the use of environmentally detrimental choloflourocarbons (CFCs). As noted in *The New York Times* on May 15, 1991, CFCs are known to be detrimental to the Earth's ozone layer and the nation's leading electronics companies are moving rapidly to find alternatives to the use of CFCs.

Some "no-clean" fluxes are available, meaning no post-soldering cleaning operation is required. However, most "no-clean" fluxes still hamper visual inspection of the solder joint and leave unsightly residues on the substrate which may cause long-term reliability problems directly by the constituents of the residue or by enhanced moisture absorption.

Another known system uses a plasma to clean printed circuit boards and components in $SF_6$ or $CF_4$ or other fluorinated gases prior to soldering. Such a system requires expensive and slow preprocessing. If the components and printed circuit boards are not stored in an oxygen free atmosphere, the effects of the cleaning are reversed; oxidation of metal surfaces will occur. Any reflow process may be used for boards processed in this fashion but the reflow process must occur in an oxygen-free atmosphere.

Another system employs a small amount (less than 1% by volume) of formic acid. Formic acid at elevated temperatures is known to be an effective reducing agent and can remove some metal oxides. The volume of formic acid is controlled by bubbling nitrogen through a tank containing the liquid chemical. However, this system requires heating the entire substrate with components to greater than 350° C. This system also requires complicated gas curtains and large pieces of equipment and is designed for mass reflow soldering which solders all of the leads on a circuit board simultaneously.

Activators other than formic acid, such as carbonic acid and nitrogen mixed with carbonic acid vapors has also been shown to be effective.

Other known systems pre-process solder and require that the bonding process take place in an expensive and cumbersome vacuum chamber. Also, the use of such a vacuum chamber slows throughput because each time a component to be soldered is placed into the chamber, the chamber must be pumped down to the proper vacuum and this takes time.

Thus, there remains a need for a solder-in-place process that provides localized soldering of individual leads to a substrate. The system used in such a process should be small and inexpensive compared to mass reflow systems. Such a system should preferably use a laser such as a Nd:YAG or other laser to provide both localized soldering and to advantageously eliminate the need to heat the entire system and circuit board to elevated temperatures. Further, the system should eliminate the need for a vacuum chamber and thus should operate at atmospheric or a slight positive pressure.

SUMMARY OF THE INVENTION

The present invention provides a gaseous-flux-assisted laser reflow system and a method of soldering leads to a substrate using a combination of a gaseous flux and laser energy. The gaseous fluxing agent is preferably nitrogen bubbled through formic or acetic acid. The fluxing agent bathes the component leads and bonding pads thereby reducing the oxides occuring on the parts in the vicinity of the region to be soldered. The fluxing agent may be admitted into the vicinity of the solder region by enclosing the component to be soldered in a low spacial volume, easily deployed fluxing chamber or by introducing the fluxing agent through a gas jet. In either case once the region to be soldered is covered with the fluxing agent, a laser beam illuminates the lead to be soldered and activates the fluxing agent.

These and other features of this invention will become more apparent by reference to the following description when taken in conjunction with the accompanying figures.

BRIEF DESCRIPTION OF THE DRAWING FIGURES

FIGS. 1A and 1B depict cross-sectional side views of the soldering system of the present invention.

FIG. 2 depicts plan view of a lens carrier used in the present invention.

Figure 6:
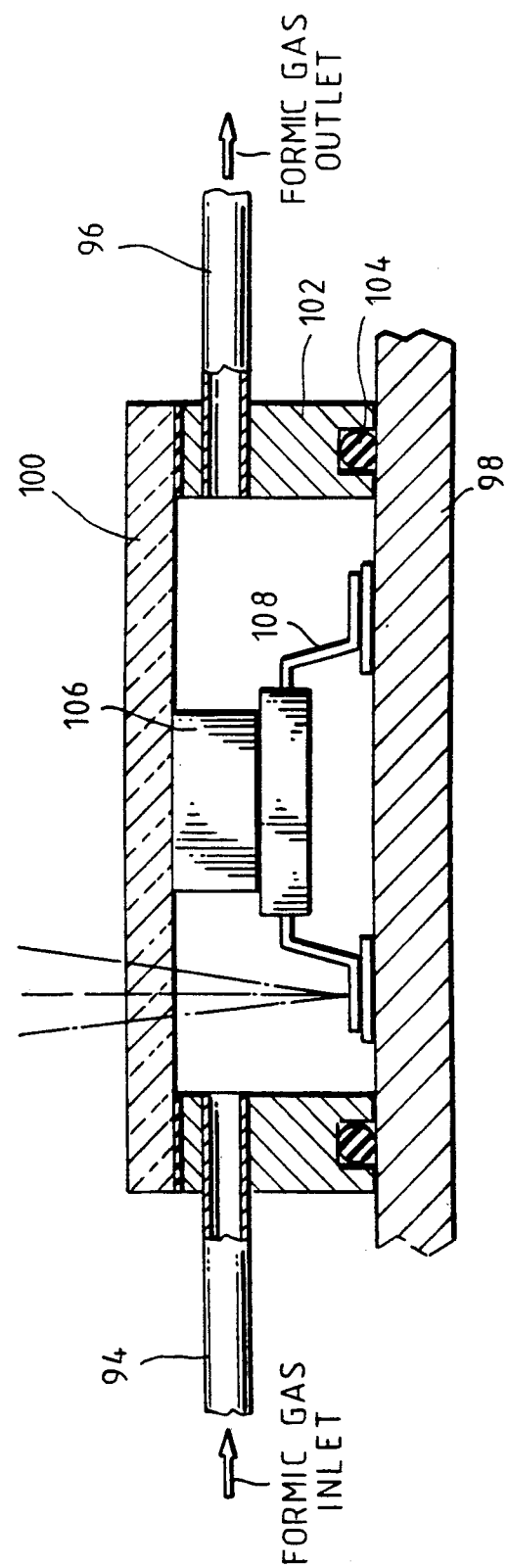

FIG. 6 provides a side view of the present invention.

DETAILED DESCRIPTION OF A PREFERRED EMBODIMENT

FIG. 1A depicts a gaseous-flux-assisted laser reflow soldering system 10 of the present invention. The system 10 includes a plenum 12 within a containment casing 14. The casing 14 and other material of the system that contact the gaseous flux, such as for example formic acid, should be made of a material appropriate to this environment. Acrylic has been found to work satisfactorily in this application and is easily machined. The casing may also be formed by any other appropriate method of manufacture such as by molding.

The system also includes a gaseous-flux inlet line 16. The inlet line 16 carries an inert gas, such as nitrogen, laden with the gaseous flux and the apparatus for charging the nitrogen with the flux is shown in greater detail in FIG. 4. An appropriate handling means 18 provides a capability of moving the system 10 from lead to lead as the soldering process continues and the handling means may provide for manual movement of the soldering system or the system may be attached to automated and numerically controlled position adjusting apparatus.

A lens carrier 20 contains a focusing lens 22 and is held in place with a set of hold-down bolts 24. The focusing lens 22 is held in place and the plenum is sealed by a seal ring 26, preferably made of a material that is impervious to the gaseous flux.

The focusing lens 22 receives a laser beam 28 and focuses the laser beam onto a lead 30 to be soldered. The system also includes optical elements (not shown) between a laser light source and the lens 22 to expand and collimate the laser beam in a manner known in the art. The lead 30 is one of many extending from an integrated circuit contained within a package 32.

The bottom of the casing 14 includes an outlet nozzle 34. The outlet nozzle may be formed integrally with the casing 14 or as a separate element as shown for ease of machining. The outlet nozzle 34 and the lens carrier 20 are sealed to the casing 14 by a pair of seal rings 36 and 38, respectively. As shown in FIG. 1, in this embodiment of the present invention, the laser beam 28 and the axis of the outlet nozzle 34 are coaxial.

During reflow soldering, the integrated circuit chip package is held firmly in place by any appropriate means while entire assembly scans across the leads of the chip package or is stepped from lead to lead and pulse to cause reflow.

In operation, nitrogen with about 1% formic acid is provided to the plenum 12 via the inlet line 16 at a pressure sufficient for the proper gas flow rate. The laser beam 28 is energized to activate the formic acid for the following reactions (where a tin based solder is used as an example):

$$SnO_2 + 2HCOOH \rightarrow SnO_2(COOH)_2 + H_2O \quad (1)$$

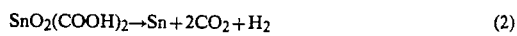

$$SnO_2(COOH)_2 \rightarrow Sn + 2CO_2 + H_2 \quad (2)$$

For a complete reaction, only tin (or other solder metal), carbon dioxide, and hydrogen remain as reaction products. In reality, not all of the formic acid will be reacted, but the solution is so dilute and the volumes are so low that this presents no environmental or health hazards.

The brief but intense heat of the laser causes the solder to melt and either directly or by re-radiation "activates" the gaseous fluxing agent. The gas acts to dissolve native oxides on the surface of the bonding metallurgies. This promotes wetting of molten solder to accomplish bonding of component leads to bonding pads. This eliminates the need for conventional liquid fluxes and precludes the need for flux removal following bonding, such as by chlorofluorocarbons or chlorocarbons (such as trichloroethane) or aqueous cleaning processes.

FIG. 1B depicts a variation of the coaxial laser/nozzle system of FIG. 1A. The system of FIG. 1A includes a supply line that provides an inert gas such as argon or nitrogen via an inert gas supply line 48. The supply line 48 provides inert gas to an annulus 50 thereby surrounding the flux gas and further lowers oxygen concentration in the solder area. The system of FIG. 2 may be in all other respects identical to the system of FIG. 1.

Figure 3:
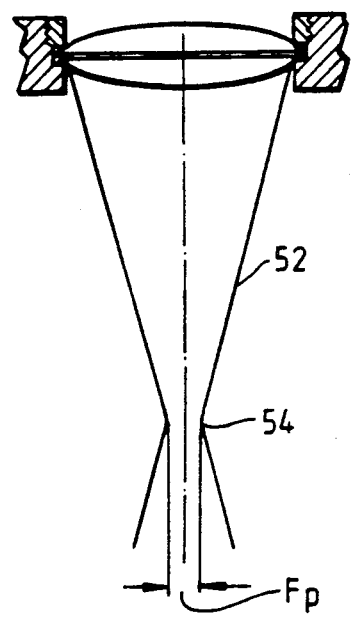
FIG. 3 depicts a detail of the focusing system in the present invention.

FIG. 3 depicts a detail of the focusing system that is useful in the present invention. It will be understood by those of skill in the art that only the extremities 52 of the laser beam are shown. The laser beam extremities 52 include a beam waste 54. The important feature is that the laser beam must have sufficient energy to both activate the flux gas and to solder reflow. The beam waste 54 is the point of the laser beam that has the greatest intensity and and was selected to be above the beam focal point FP at the device lead to obtain the greatest activation of the gaseous flux.

Figure 4:
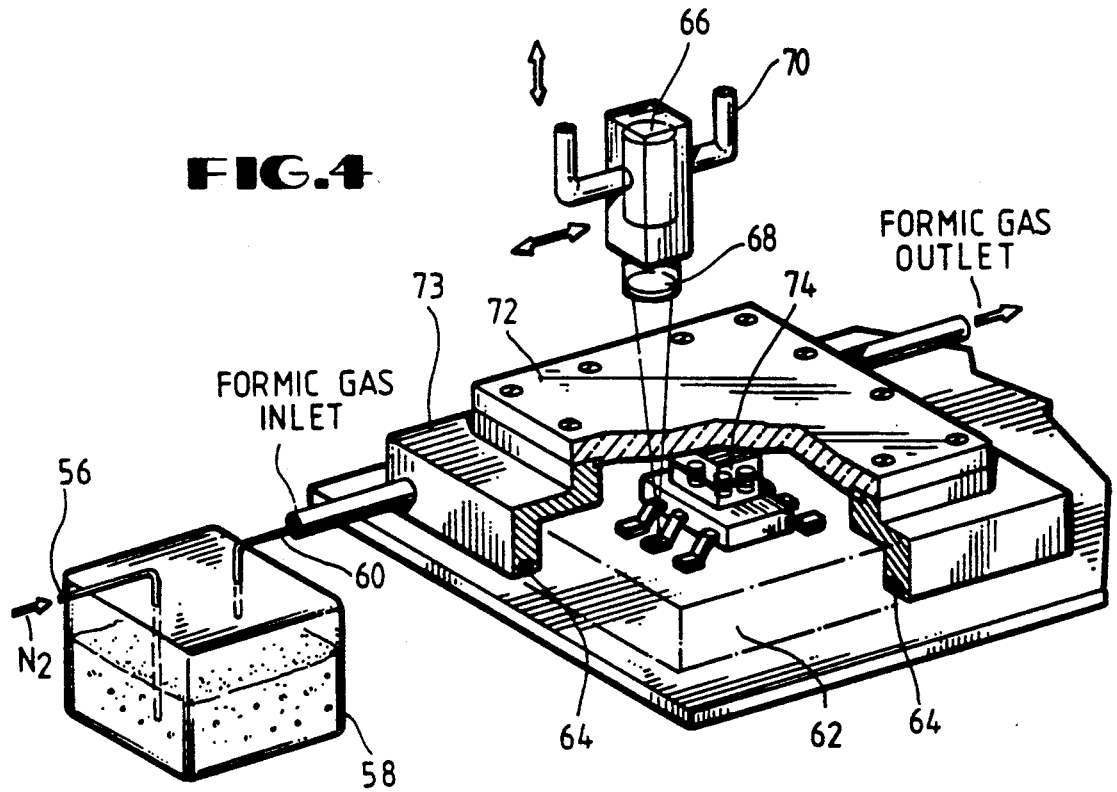
FIG. 4 depicts a partial cutaway view of the overall soldering system.

FIG. 4 depicts another embodiment of the present invention. A nitrogen supply line 56 provides $N_2$ gas to a formic acid bubble tank 58. The nitrogen supply line 56 terminates within the bubble tank 58 below the level of the formic acid within the bubble tank and a formic acid inlet line 60 terminates within the bubble tank above the level of the formic acid. The formic acid inlet line 60 provides a slight pressure of the formic acid laden nitrogen gas to a temporarily sealed plenum chamber 62. The plenum chamber is temporarily sealed by a set of flexible and pliable feet 64. When component soldering is complete, the entire plenum unit is simply lifted and placed around the next component to be soldered thereby temporarily sealing the new component against the intrusion of outside oxygen rich atmosphere.

The system of FIG. 4 further includes a Nd:YAG laser light source beam delivery system 66 and its associated beam shaping and focusing optics 68. Reference number 66 represents a beam delivery system and those of skill in the art will recognize that the prefered Nd:YAG laser is relatively large compared to other lasers such as helium-neon lasers. The laser light source 66 and the associated optics 68 are mounted on a harness 70 which permits movement of the laser and optics combination in each of the X, Y, and Z directions. This movement may manual or under full direct numerical control by method known in the numerical control art.

The laser light source 66 directs the laser light through a transparent cover 72. The transparent cover 72 provides a window through which the laser light is directed. The transparent cover 72 and a substantially hollow frame 73 form the plenum chamber 62. The system further includes a hold-down pad 74 to hold the IC chip package in place while the laser light source 66 scans the leads of the package. The hold-down pad 74 may also be adapted to directly hold the leads of the IC chip package against the substrate pads. Thus, as used herein, the term "hold-down pad" refers to a pad that contacts the IC chip package or directly holds the leads of the IC chip package to the substrate pads. Finally, the system includes a formic gas outlet 76 that carries the expended gas mixture for scrubbing and subsequent use, thereby minimizing waste products.

Figure 5:
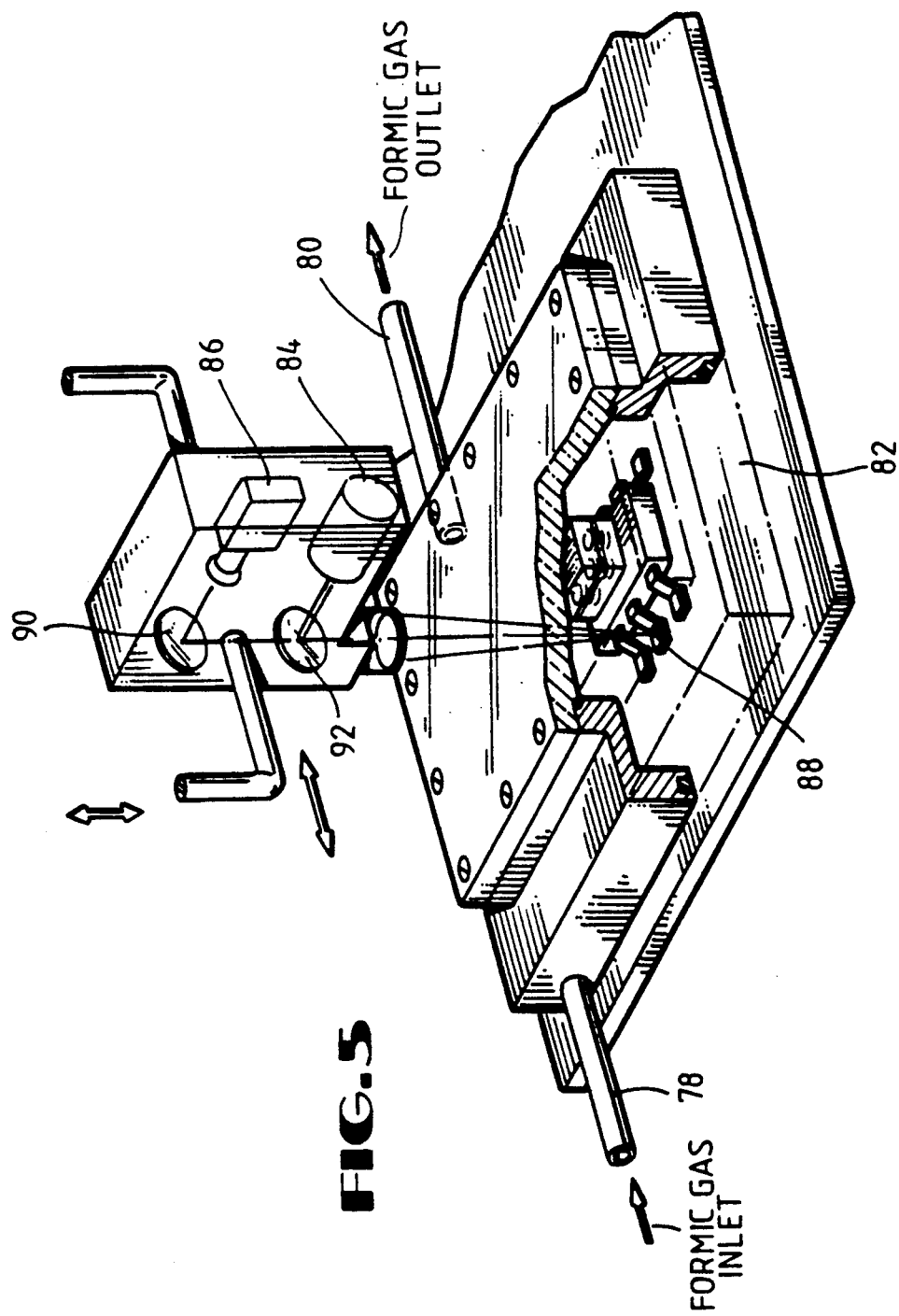
FIG. 5 depicts another partial cutaway view of the overall soldering system showing additional features of the invention.

The system of FIG. 5 provides a further control means to the system of FIG. 4. The system of FIG. 5 includes a formic gas inlet 78 and outlet 80 which provide a slight pressure of formic gas laden nitrogen to a plenum chamber 82. The system further includes a laser light source, such as a Nd:YAG laser beam delivery system 84, and a television camera 86. As before with regard to laser light source 66 in FIG. 4, beam delivery system 84 delivers laser energy from a Nd:YAG laser which is relatively large. The television camera views the working area 88 where soldering is taking place by means of a full reflector 90 angled preferably at a 45° angle to the vertical. The term "full reflector" means that the mirror or reflector reflects light in the visible spectrum as well as infrared and ultraviolet light. The laser light source 84 directs the laser light beam onto the working area 88 by means of a dichroic reflector which is also preferably angled at a 45° angle to the vertical. The dichroic reflector reflects laser light frequencies and passes video-input visible light. As with the system of FIG. 4, the laser and associated components are mounted for manual movement or for full direct numerical control.

FIG. 6 provides a side view of a preferred embodiment of the present invention. A gas inlet line 94 and a gas outlet line 96 deliver flux gas to and removes flux gas from a plenum chamber 98. A quartz cover 100 attaches to an aluminum casing 102 by any appropriate means but not by means of screws as shown in FIGS. 4 and 5. The casing 102 is grooved on the bottom legs to accommodate a seal 104. The seal 104 is pliable so that it can compress and seal the plenum chamber from the atmosphere and form a seal with the underlying substrate such as a printed wiring board or multi-chip module. Attached to the underside of the quartz cover 100 is a hold-down pad 106 similar to the hold-down pad 74. The integrated circuit chip package has leads 108 which rest in contact with pads 110 of solder material.

The process of the present invention involves placing the apparatus in contact with a printed wiring board to provide a plenum, purging the the plenum with a mixture of a flux gas, preferably about 1% formic acid in nitrogen gas, and scanning the laser light across the leads of the IC package. The Nd:YAG laser preferably emits at 1.064 μm. The beam at the lead pad position is set to a beam diameter of 0.070 inches as measured at the $1/e^2$ point. The average power is preferably 15 watts and the laser scans at about 14 inches a minute.

The gas flow rate of nitrogen through the bubble chamber is about 1 cubic foot per hour.

While the present invention has been described in connection with a preferred embodiment, those of ordinary skill in the art will recognize many modifications to the present invention and this application is intended to cover any adaptations or variations of the invention.

I claim:

1. A gas flux assisted, laser reflow soldering system comprising:
   a. a plenum chamber;
   b. a gas flux inlet line coupled to the plenum chamber to carry gas flux to the plenum chamber;
   c. an outlet nozzle from the plenum chamber for directing gas flux toward a conductor of an integrated circuit package, the outlet nozzle having an axis;
   d. a laser light source having an axis coaxial with the nozzle axis, the laser light source directing a laser beam along said nozzle axis toward said conductor of said integrated circuit package; and
   e. a focusing lens in the axis of the laser light source to focus the laser beam on said conductor to be soldered.

2. The system of claim 1 wherein the outlet nozzle includes an annulus and wherein the outlet nozzle is coupled to a source of inert gas.

3. The system of claim 1 further comprising a hold-down pad coupled to the plenum chamber and sized to accommodate an integrated circuit chip package.

4. The system of claim 1 wherein the focusing lens is sealed to the plenum chamber.

5. The system of claim 1 wherein the outlet nozzle is substantially conical.

6. The system of claim 1 wherein the gas flux inlet line carries formic acid entrained in nitrogen.

7. A gas flux assisted laser soldering system comprising:
   a. a nitrogen source;
   b. a bubble chamber coupled to the nitrogen source and capable of containing a quantity of the liquid phase of a gaseous flux;
   c. a gas flux inlet line coupled to the bubble chamber and capable of carrying a gaseous flux;
   d. a plenum chamber coupled to the gas flux inlet line and formed of vertical walls and a transparent cover, the walls having lower edges with grooves formed therein capable of containing a pliable sealing material; and
   e. a laser light source outside the chamber, the light source having an axis that penetrates the transparent cover.

8. The system of claim 7 wherein the flux comprises formic acid.

9. The system of claim 7 wherein the laser light source is mounted on a harness capable of moving the laser light source in the vertical or horizontal directions.

10. The system of claim 7 further comprising a hold-down pad on the underside of the transparent cover that is sized to accommodate an integrated circuit package.

11. A gas flux assisted laser soldering system comprising:
   a. a gas flux inlet line capable of carrying a gaseous flux;
   b. a plenum chamber coupled to the gas flux inlet line and formed of vertical walls and a transparent cover, the walls having lower edges with grooves formed therein capable of containing a pliable sealing material;
c. a laser light source outside the chamber, the light source emitting light along a first optical path;
d. a dichroic mirror positioned in the first optical path, the dichroic mirror directing the emitted light along a second optical path that penetrates the transparent cover to a working area within the plenum chamber;
e. a television camera aimed along a third optical path, the television having a field of view; and
f. a full reflector in the third optical path to direct the field of view of the camera along the second optical path.

12. The system of claim 11 wherein the laser light source is mounted on a harness capable of moving the laser light source in the vertical or horizontal directions.

13. The system of claim 11 further comprising a hold-down pad on the underside of the transparent cover that is sized to accommodate an integrated circuit package.

14. A method of soldering comprising:
 a. introducing a gaseous flux into a chamber to totally surround an area to be soldered; and
 b. shine a laser beam spot of sufficient energy to activate the gaseous flux and to cause solder reflow on the area to be soldered.

15. A method of laser soldering of an integrated circuit lead to a conductor on a substrate, comprising the steps of:
 positioning said lead on said conductor;
 aiming a nozzle of a chamber containing a gas flux toward said lead;
 directing a laser beam through said chamber and onto said lead, said laser beam being directed along a line coaxial with said nozzle.

16. A process of soldering a plurality of conductors of an integrated circuit chip package to a printed wiring board, comprising the steps of:
 a. placing a chamber above said conductors, with the conductors positioned on a printed wiring board;
 b. purging the chamber with a mixture of a flux gas;
 c. and scanning a laser light beam across said conductors of said integrated circuit package.

* * * * *